United States Patent
Chung et al.

(10) Patent No.: US 6,555,899 B1
(45) Date of Patent: Apr. 29, 2003

(54) SEMICONDUCTOR PACKAGE LEADFRAME ASSEMBLY AND METHOD OF MANUFACTURE

(75) Inventors: Young Suk Chung, Seoul (KR); Sung Sik Jang, Kyunggi-do (KR); Jae Hak Yee, Singapore (SG)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/687,541

(22) Filed: Oct. 13, 2000

(Under 37 CFR 1.47)

(30) Foreign Application Priority Data

Oct. 15, 1999 (KR) .............................................. 99-44656

(51) Int. Cl.⁷ .............................................. H01L 23/495
(52) U.S. Cl. ........................................ 257/670; 257/666
(58) Field of Search ................................ 257/666, 670, 257/669, 676, 692

(56) References Cited

U.S. PATENT DOCUMENTS

| | | | |
|---|---|---|---|
| 4,530,152 A | 7/1985 | Roche et al. ................ | 29/588 |
| 5,041,902 A | 8/1991 | McShane .................... | 357/79 |
| 5,157,480 A | 10/1992 | McShane et al. ............ | 357/74 |
| 5,172,213 A | 12/1992 | Zimmerman ................ | 257/796 |
| 5,172,214 A | 12/1992 | Casto ........................ | 257/676 |
| 5,278,446 A | 1/1994 | Nagaraj et al. ............. | 257/707 |
| 5,327,008 A * | 7/1994 | Djennas et al. ............. | 257/666 |
| 5,428,248 A | 6/1995 | Cha ........................... | 257/676 |
| 5,521,429 A | 5/1996 | Aono et al. ................. | 257/676 |
| 5,701,034 A | 12/1997 | Marrs ........................ | 257/706 |
| 5,783,861 A | 7/1998 | Son ........................... | 253/693 |
| 5,789,806 A * | 8/1998 | Chua et al. ................. | 257/676 |
| 5,835,988 A | 11/1998 | Ishii .......................... | 257/684 |
| 5,866,939 A | 2/1999 | Shin et al. .................. | 257/666 |
| 5,894,108 A | 4/1999 | Mostafazadeh et al. ..... | 174/52.4 |
| 5,977,613 A | 11/1999 | Takata et al. ............... | 257/666 |
| 5,977,630 A | 11/1999 | Woodworth et al. ........ | 257/712 |
| 6,081,029 A * | 6/2000 | Yamaguchi ................. | 257/718 |
| 6,143,981 A | 11/2000 | Glenn ........................ | 174/52.4 |
| 6,229,200 B1 | 5/2001 | Mclellan et al. ............ | 257/666 |
| 6,229,205 B1 * | 5/2001 | Jeong et al. ................ | 257/676 |
| 6,242,281 B1 | 6/2001 | Mclellan et al. ............ | 438/106 |
| 6,294,100 B1 | 9/2001 | Fan et al. ................... | 216/14 |
| 6,303,984 B1 * | 10/2001 | Corisis ....................... | 257/670 |
| 6,355,502 B1 | 3/2002 | Kang et al. ................. | 438/110 |

FOREIGN PATENT DOCUMENTS

| | | |
|---|---|---|
| JP | 57-45959 | 3/1982 |
| JP | 58-101317 | 6/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 58-160095 | 9/1993 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

* cited by examiner

*Primary Examiner*—Kamand Cuneo
*Assistant Examiner*—Scott Geyer
(74) *Attorney, Agent, or Firm*—Stetina Brunda Garred & Brucker (57) ABSTRACT

A semiconductor package and the leadframe therefor having a reverse-down set part formed in the tie bar supporting the chip paddle. The reverse-down set part of the tie bar may be formed by a mechanical stamping process in such a way that it is present within the insulating body, interlocking therewith. This feature also facilitates the prevention of a short circuit between the tie bar that is exposed externally from the package body and the exposed internal lead through solder upon the mounting of a semiconductor package onto a motherboard.

19 Claims, 10 Drawing Sheets

SEMICONDUCTOR PACKAGE LEADFRAME ASSEMBLY AND METHOD OF MANUFACTURE

BACKGROUND OF THE INVENTION

1. Field of the Invention

The present invention relates to packaged semiconductors, semiconductor packages, leadframe assemblies therefor and a method of manufacture, and more particularly, but not by way of limitation, to a semiconductor leadframe and method incorporating a reverse-down set portion in a region of the tie bar for its securement within the semiconductor package.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal lead frames for supporting an integrated circuit chip which is bonded to a chip paddle region formed centrally therein. Bond wires which electrically connect pads on the integrated circuit chip to individual leads of the lead frame are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a lead frame as the central supporting structure of such a package. A portion of the lead frame completely surrounded by the plastic encapsulant is internal to the package. Portions of the lead frame extend internally from the package and are then used to connect the package externally. More information relative to lead frame technology may be found in Chapter 8 of the book *Micro Electronics Packaging Handbook,* (1989), edited by R. Tummala and E. Rymaszewski, incorporated by reference herein. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, which results in increased consumer demand. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are generally manufactured in the same manner.

Figure 1:
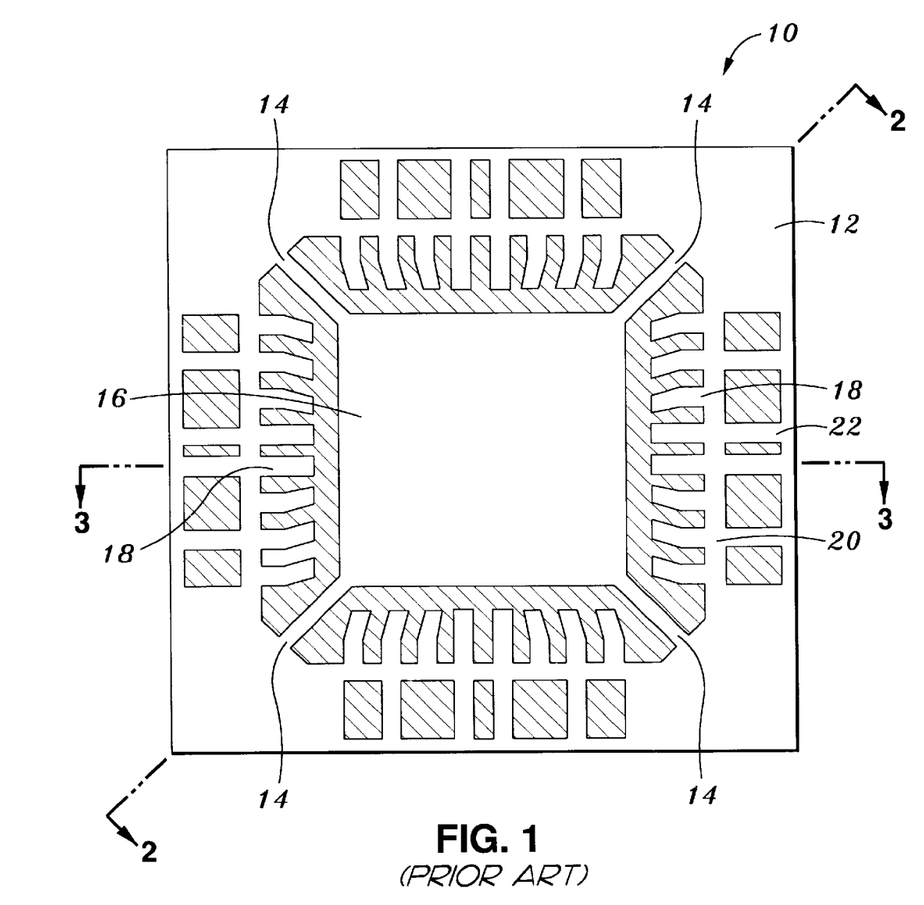
FIG. 1 is a top plan view of a conventional metal lead frame structure adapted for securement within a semiconductor package.

In further description of the above-described semiconductor package in FIG. 1, the leadframe 10 is therein shown. The leadframe 10 comprises a plate type body 12 typically formed of metal and constructed with tie bars 14 extending from each of four corners surrounding a chip paddle 16 adapted for supporting an integrated circuit die also referred to as a "chip." The chip is not shown in this particular view for purposes of illustration and will be discussed below. Along and at a distance away from the circumference of the paddle 16, a plurality of internal leads 18 are radially formed on the leadframe body 12. From the internal leads 18, external leads 22 are extended with their terminals being connected to the frame body 12. With connection to the frame body 12, dam bars 20 are provided between the internal leads 18 and the external leads 22 in order to prevent an encapsulation material from flowing over the external leads 22 upon encapsulating and to firmly fix the internal leads 18 and the external leads 22 to the frame body 12. The dam bars 20, the external leads 22, predetermined areas of the tie bars 14, and the frame body 12 are all removed in a subsequent singlulation process. A large number of this type of leadframes 10 may be formed in a larger frame body 12 in a matrix form.

Along the periphery of the sides of the chip paddle 16 and at the ends of the internal leads directing to the chip paddle 16, there are formed half-etched parts 15 which will be shown and discussed below.

Figure 2:
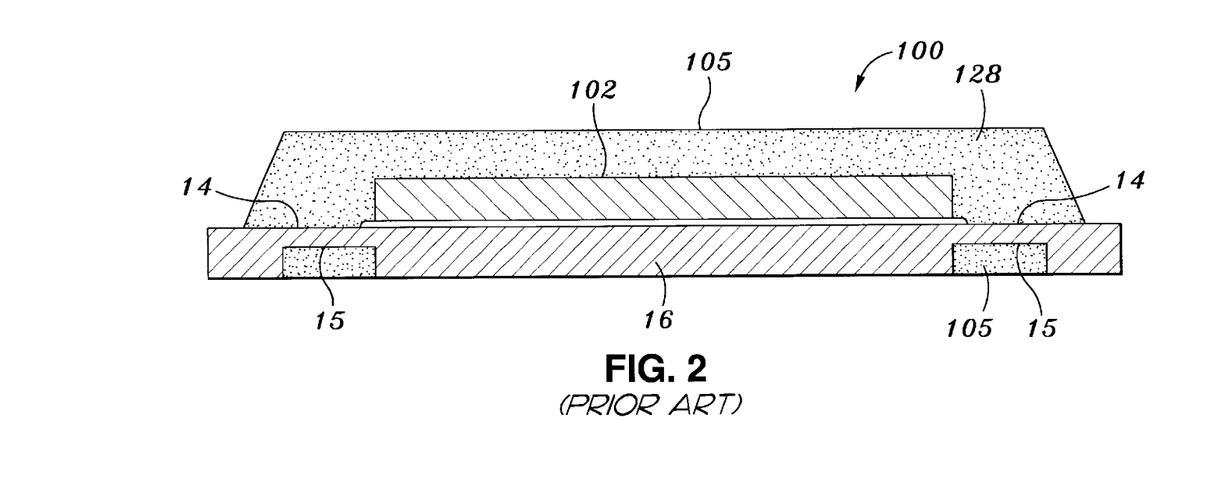
FIG. 2 is a side elevational, cross-sectional view of a semiconductor package utilizing the lead frame of FIG. 1 and taken along lines 2—2 thereof.

Referring now to FIG. 2, there is shown a side elevational cross-sectional view, of a semiconductor package 100, taken along the line 2—2 of the leadframe illustrated in FIG. 1, for purposes of reference. It may be seen in this view that a deep half-etched part 15 is formed in the underneath side of the tie bar 14 along a predetermined area near the internal leads 18 and at the corner of the chip paddle 16. Generally, this and the other half-etched parts discussed herein are formed by a chemical etching process. This chemical etching process is usually conducted after a general design of the leadframe 10 is completed. As well known, areas in which the half-etched parts, such as tie bar region 15, are to be formed remain uncoated with photoresist while the other areas are coated with photoresist before an etchant is applied to the leadframe 10. In the body 12 which is formed in a fabrication process later, paddle 16 and the internal leads from seceding from the body 12 horizontally or vertically or making lengthy a passage through which moisture can permeate the chip, so as to restrain the moisture absorption to the semiconductor package. In addition, the half-etched parts 15 formed in the tie bars 14 interlock the chip paddle 16 and the tie bars with the body 12. When mounting the semiconductor package 100 onto a motherboard by use of the leadframe 10, the half-etched parts 15 allow the internal leads 18 to be distant from the tie bars 14 to prevent the internal leads 18 and the tie bars 14 from forming a short circuit through the solder that is applied. This will be described in more detail below.

Still referring to FIG. 2, the package 100, as shown herein, includes an integrated circuit chip 102 mounted to the chip paddle 16. An encapsulation material 105 has been poured over the chip 102 and leadframe 10 to form a semiconductor package body 128. It may also be seen that the encapsulation material 105 is also present within the recesses formed by the half-etched parts 15 formed in the tie bars 14. The semiconductor package 100, as shown herein, comprises the semiconductor chip 102 described above, having a plurality of bond pads 112 (shown in FIG. 3) disposed around the circumference of the upward surface of the chip 102, and a chip paddle 16 which is bonded to the bottom surface of the semiconductor chip 102 via a conventional adhesive.

Figure 3:
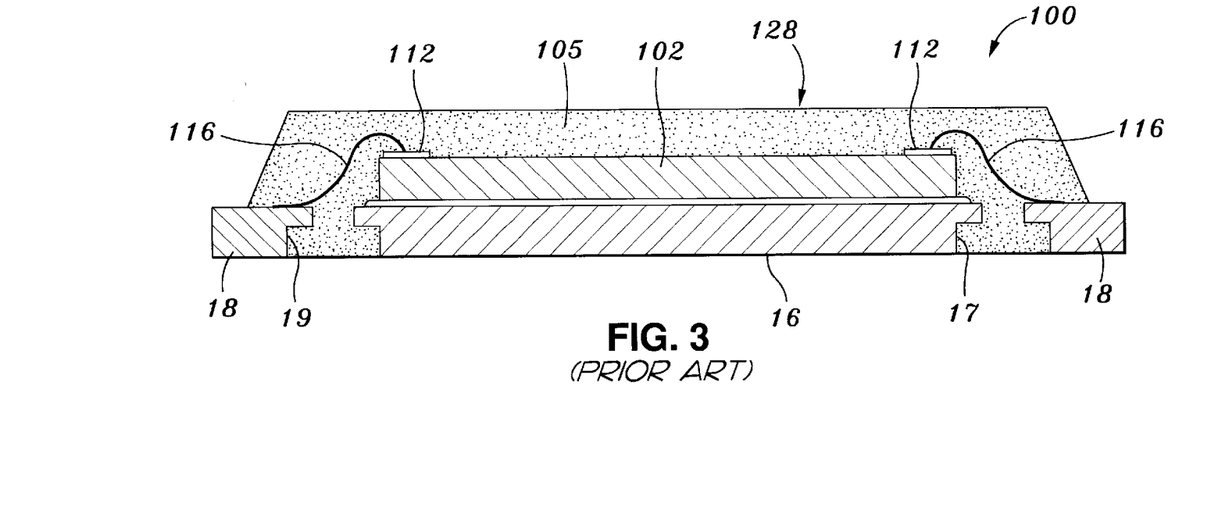
FIG. 3 is a side elevational, cross-sectional view of the semiconductor package of FIG. 2, taken along the lines 3—3 of the leadframe of FIG. 1 illustrating another aspect of the construction of prior art leadframe structures.

Referring now to FIG. 3, there is shown the semiconductor package 100 in a side-elevational cross-sectional view illustrating other aspects of the assembly thereof. In this particular cross-sectional view of the semiconductor package 100 taken along lines 3—3 of the package 100 including the conductive wires extending from the semiconductor chip to be discussed below. The chip paddle 16 has a half-etched part 17 along the circumference of its side. At the corners of the chip paddle 16 are formed tie bars 14 which externally extend and have half-etched parts 15. A plurality of internal leads 18, each of which has a half-etched part 19 at the end facing the chip paddle 16, are radially located along the circumference of the chip paddle 16. Via conductive wires 116, the bond pads 112 of the semiconductor chip 102 are electrically connected to the internal leads 18. The semiconductor chip 102, the conductive wires 116, the chip paddle 16 and the internal leads 18 are encapsulated by an encapsulation material to create a package body 128 whereas the chip paddle 16, the internal leads 18 and the tie bars 14 are externally exposed in the downward direction of the package body 128.

Figure 4:
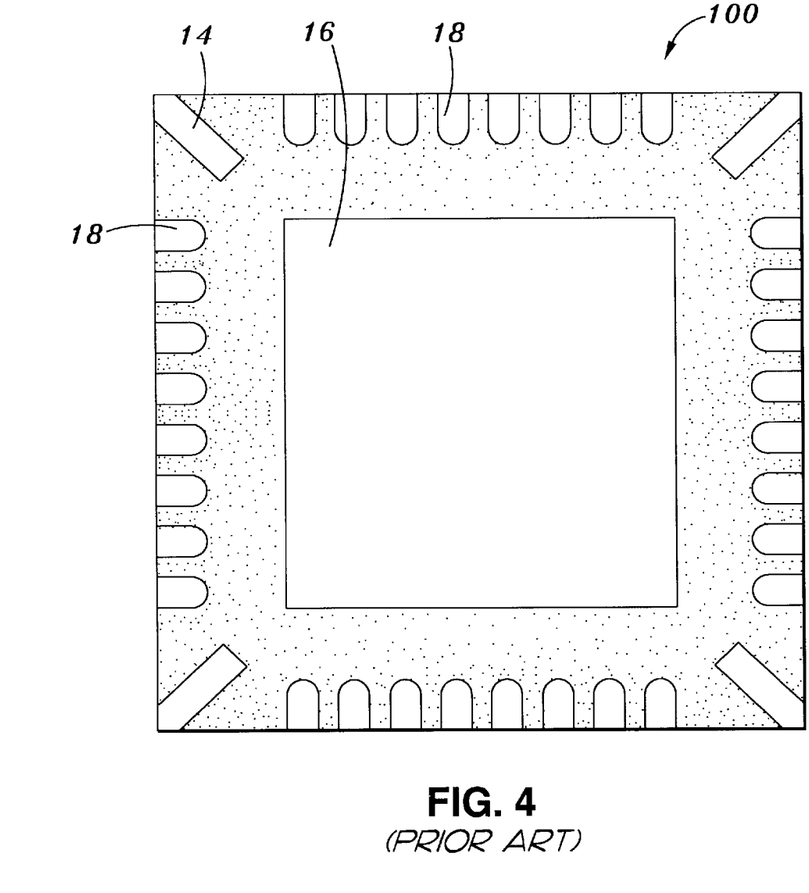
FIG. 4 is a bottom plan view of the semiconductor package of FIG. 2 illustrating the footprint thereof.

As mentioned above, the formation of the half etched parts 19 and 17 at the sides and ends of the internal leads 18 and the chip paddle 16 have advantages of preventing the internal leads 18 or the chip paddle 16 from seceding from the body horizontally or vertically as well as allowing the internal leads 18 and the tie bars 14 to be distant from the bottom surface of the body 128, so as to restrain the formation of a short circuit through solder upon mounting the package onto the motherboard. In addition, a half etched part 15 is formed in a predetermined area of the tie bar 14, interlocking with the body 128. Also, the half etched parts make the tie bars 14 spaced away from the internal leads 18 so as to prevent the formation of a circuit between the internal leads 18 and the tie bars 14 via a solder upon the mounting. This aspect may be seen in the footprint of semiconductor package 100 illustrated in FIG. 4, wherein the tie bar 14 is shown adjacent the leads 18 outwardly of chip paddle 16.

The leadframe described above is one that is formed by chemical etching. Such a leadframe is advantageous in that it can be fabricated at a small quantity in a short period of time. Upon mass production, however, it is required that chemical solutions necessary for various chemical treatment processes are accurately controlled as to concentration, treatment period of time, flow rate, etc. In addition, its costs are high because of low UPH (productivity) and a large area for accommodating facilities.

Much effort is thus being made to adopt mechanical stamping techniques in the mass production of semiconductor packages. In the stamping techniques, the shape of the conventional half etched part can be formed by conducting on a predetermined area of the internal lead a coining process (a technique in which a predetermined area of a leadframe is strongly pressed to widely spread out the area in a ribbon shape and thus, the pressed area is thinner than other areas). However, these techniques are very difficult to apply for the conventional half etched part formed in the tie bars. For example, when a coining process is applied to the four tie bars, too much stress is on the tie bars which support the chip paddle, making the chip paddle bent, oblique or deformed. If the shape such as the conventional half etched part is absent in the tie bars, they are externally exposed in the direction of the bottom surface of the semiconductor package. In this condition, the tie bars come into so close contact with the internal leads that the internal leads and the tie bars may readily form a short circuit through the solder upon the soldering of the semiconductor package onto the motherboard.

SUMMARY OF THE INVENTION

The present invention relates to semiconductor packages and leadframe assemblies of improved design and reliability. More particularly, one aspect of the present invention comprises a semiconductor package leadframe assembly wherein the leadframe includes a plate type frame body, a plurality of tie bars extending from the body to the central part of the leadframe, a chip paddle connected to the tie bars, and a plurality of internal leads radially formed at regular intervals along the circumference of the chip paddle. The chip paddle is the type adapted to receive a semiconductor chip thereupon, and the tie bars are formed with reverse-down set portions formed in a predetermined area of each of the tie bars near the chip paddle. In this manner, this region of the tie bar is not exposed externally from the package body. Instead, the reverse-down set portion is present within the insulating body interlocking therewith, in bringing about a prevention effect to prevent the formation of a short circuit between an exposed tie bar region and the internal lead through solder upon the mounting of the semiconductor package onto a motherboard.

In another aspect of the present invention described above, the ends of the internal leads near the chip paddle are also made thinner by forming coining parts or portions at the ends of the internal leads.

In yet another aspect of the present invention, a semiconductor package comprises a semiconductor chip provided with a plurality of input and output pads; a chip paddle bonded to the bottom surface of the semiconductor chip via an adhesive; a plurality of tie bars externally extended from the corners of the chip paddle; a plurality of internal leads located at regular intervals along the circumference of the chip paddle; conductive wires for electrically connecting the bond pads of the semiconductor chip to the internal leads; and a package body in which the semiconductor chip, the chip paddle, the tie bars, the internal leads and the conductive wires are encapsulated by an encapsulation material while the chip paddle, the tie bars and the internal leads are externally exposed at their bottom surfaces. Each tie bar includes a reverse-down set portion formed in a predetermined area thereof near the chip paddle to afford security of the tie bar within the encapsulation material in preventing the tie bar from being exposed to conductive portions of the semiconductor package that could cause a short therewith.

In yet a further aspect of the present invention, a method of securing a metal leadframe within a semiconductor package is set forth. The method includes the steps of forming a leadframe with a chip paddle generally centrally disposed therein, the chip paddle being connected to outer frame portions by oppositely disposed tie bars extending therebetween. An encapsulation material is provided for encasing a semiconductor chip disposed upon the chip paddle. The tie bars are also formed with reverse-down set portions between the chip paddle and the leadframe for preventing the tie bars from being exposed along the lower region of the semiconductor package. The semiconductor chip is secured to the chip paddle and electrically interconnected to select portions of the lead frame. The semiconductor chip and leadframe is then encapsulated with the reverse-down set portions of the tie bars encapsulated therein so as to prevent lateral movement of the tie bar relative to the encapsulant.

BRIEF DESCRIPTION OF THE DRAWINGS

A more complete understanding of the method and apparatus of the present invention may be obtained by reference to the following detailed description when taken in conjunction with the accompanying drawings wherein.

DETAILED DESCRIPTION OF THE PREFERRED EMBODIMENTS

The present invention may be understood more readily by reference to the following detailed description of preferred embodiments of the invention and the figures.

Referring first to FIGS. 1–4, there is shown a prior art embodiment of a leadframe and semiconductor package incorporating the leadframe assembly therein. These particular views have been discussed above. These drawings illustrate the fact that the etched regions of the leadframe prevent the leadframe from being exposed in the footprint of the semiconductor pad, which step is formed by etching or the like. Although advantageous, certain disadvantages are associated therewith, as noted above. The present invention defines an improvement over these prior art leadframes by eliminating some or all of these disadvantages.

Figure 5:
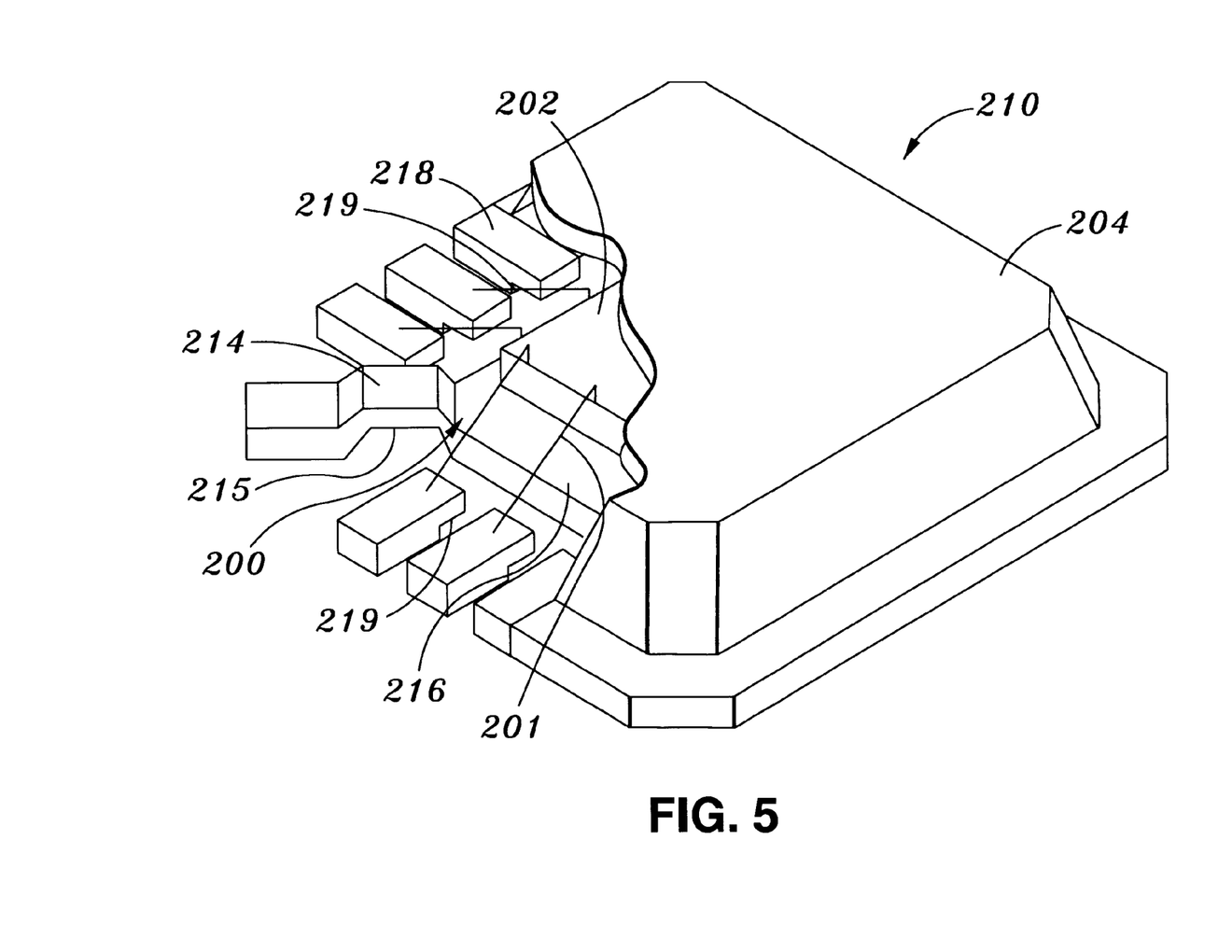
FIG. 5 is a cutaway perspective view of a semiconductor package incorporating the improved lead frame assembly of the present invention.

Referring now to FIG. 5, there is shown a cutaway perspective view of a semiconductor package 210 incorporating the leadframe 200 of the present invention, within the semiconductor package body 128. Shown by virtue of the cutaway portion of the semiconductor encapsulant forming body 204 is chip paddle 216 disposed adjacent a plurality of internal leads 218. The upper side of each one of the plurality of internal leads 218 may, but does not necessarily have to be, electroplated with an electrically conductive material such as, but not limited to, gold or silver, to enhance electrical conductivity. Connecting wires 201 extend between the integrated circuit chip 202 and the internal leads 218. The tie bar 214 is also shown to be formed with a reverse-down set part 215 located adjacent the chip paddle 216. Owing to the presence of the reverse-down set part 215, the tie bar 214, which is exposed from beneath the package body as described below, is further spaced from the internal leads 218 so that the possibilities of short circuits between the tie bar 214 and the internal leads 218 are reduced. Such a short can be formed by solder when mounting the semiconductor package on a motherboard or the like.

Figure 6:
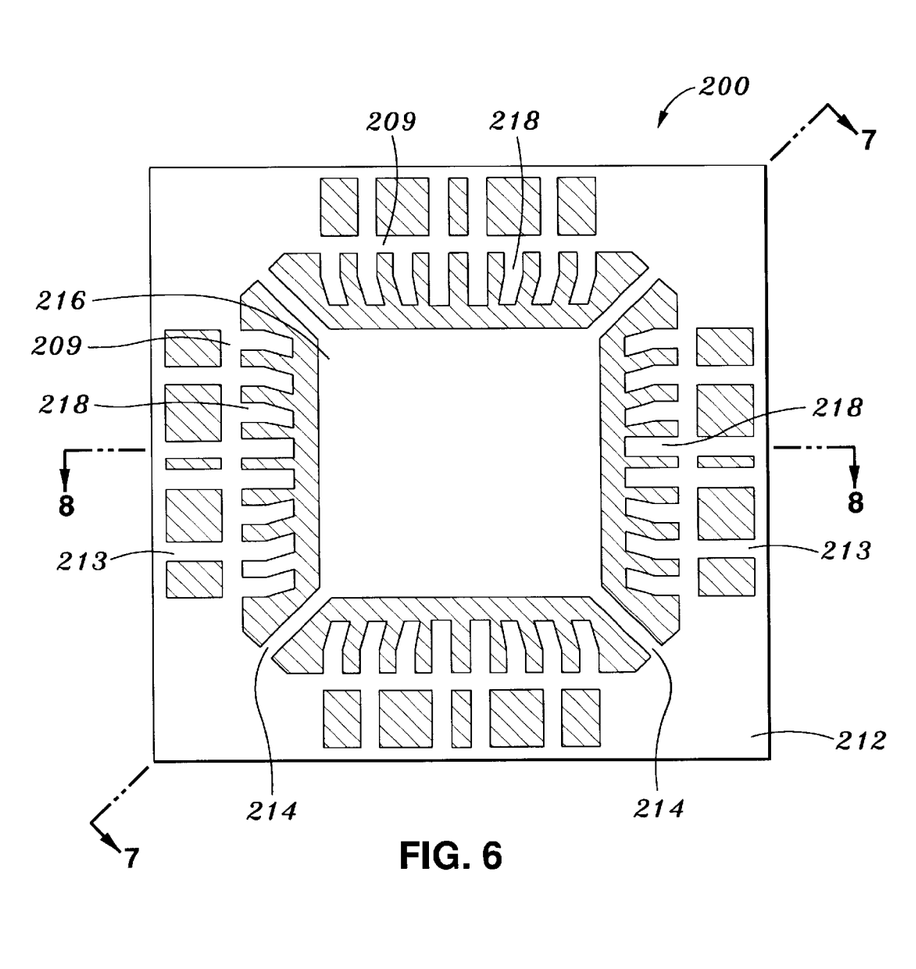
FIG. 6 is a top plan view of a metal leadframe structure constructed in accordance with the principles of the present invention and illustrating the reverse-down set portions of the tie bars thereof.

Referring now to FIG. 6, there is shown a top plan view of the leadframe 200 constructed in accordance with the principles of the present invention. The leadframe 200 is constructed with a plate type frame body 212 provided with tie bars 214 as shown and internally extending from each of the four (or two) corners. At least two tie bars are typically used in metal leadframe fabrication, and the present invention is directed to any metal leadframe assembly having tie bars constructed therein. Being in contact with the tie bars 214, a roughly square chip paddle 216 is provided. Along and at a distance away from the circumference of the chip paddle 216, a plurality of internal leads 218 are radially formed on the frame body 212. From the internal leads 218, external leads 213 are extended with their terminals being connected to the frame body 212. With connection to the frame body 212, dam bars 209 are provided between the internal leads 218 and the external leads 213 in order to prevent an encapsulation material from flowing over the external leads 213 upon encapsulating and to firmly fix the internal leads 218 and the external leads 213 to the frame body 212.

Figure 7:
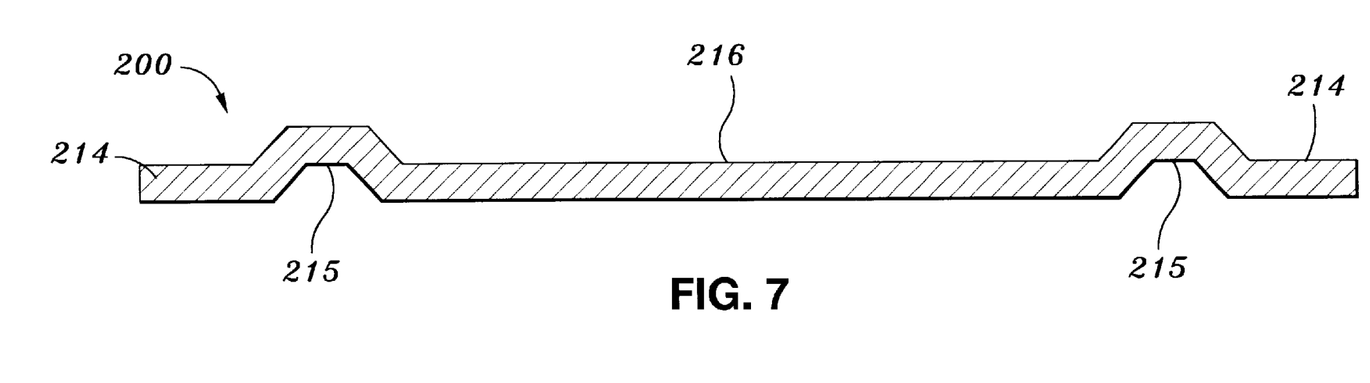
FIG. 7 is a side elevational, cross-sectional view of the tie bar and paddle assembly of FIG. 6 taken along the lines 7—7 thereof.
Figure 8:
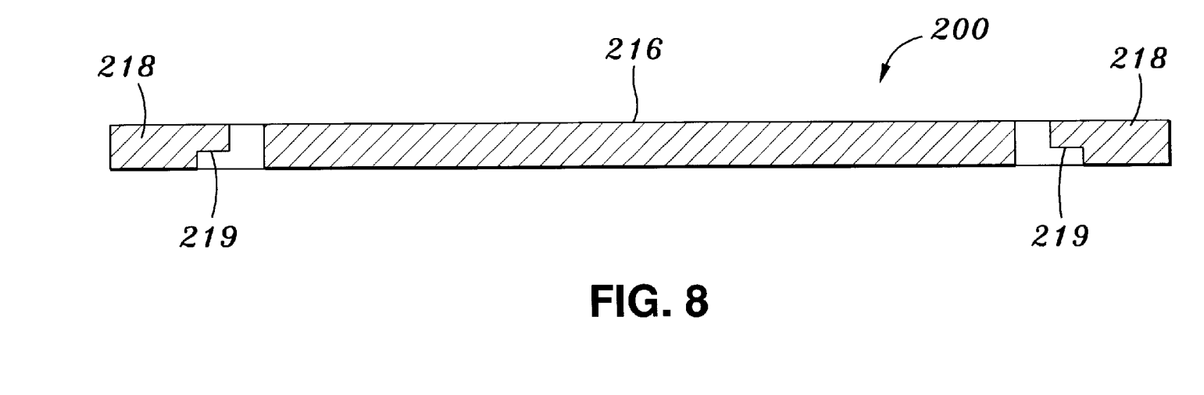
FIG. 8 is a side elevational, cross-sectional view of a semiconductor package utilizing the leadframe of FIG. 6 and taken along lines 8—8 thereof to illustrate the securement of a semiconductor chip therein and the reverse-down set regions of the tie bar adjacent thereto.

Referring now to FIGS. 5, 7 and 8 in combination, the present invention is featured in that a predetermined area of each tie bar 214 which extends externally from a corner of the chip paddle 216, is bent to a predetermined length in an upward direction to form a reverse-down set region 215 (FIG. 7). As shown in detail in FIG. 5, the reverse-down set part 215 is bent more upwardly than the plane of the chip paddle 216, the internal lead 218 and the external lead form together. This reverse-down set part 215 is formed by mechanical stamping. That is, predetermined areas of the tie bars 214 (in the vicinity of the square corners of the chip paddle 216) are punched to form such a reverse-down set part 215.

As seen in FIGS. 5 and 8 inside the body, coining parts 219 are formed at the internal leads' ends near the circumference of the chip paddle 216, so that the internal leads 218 are made thinner at their ends. The coining parts may also be formed by a half etching process as in the prior art discussed above.

As shown most clearly in FIG. 5, the reverse-down set part 215 of the tie bar 214 is located inside and thus, is later interlocked with a package body 128. In result, owing to the presence of the reverse-down set part 215, the tie bar 214, which is exposed from the package body 128, is further spaced from the internal lead 218, so that a short circuit between the tie bar 214 and the internal lead 218 is reduced. Such shorting can be produced by the solder when mounting the semiconductor package on the motherboard. This will be in more detail described below.

Figure 9:
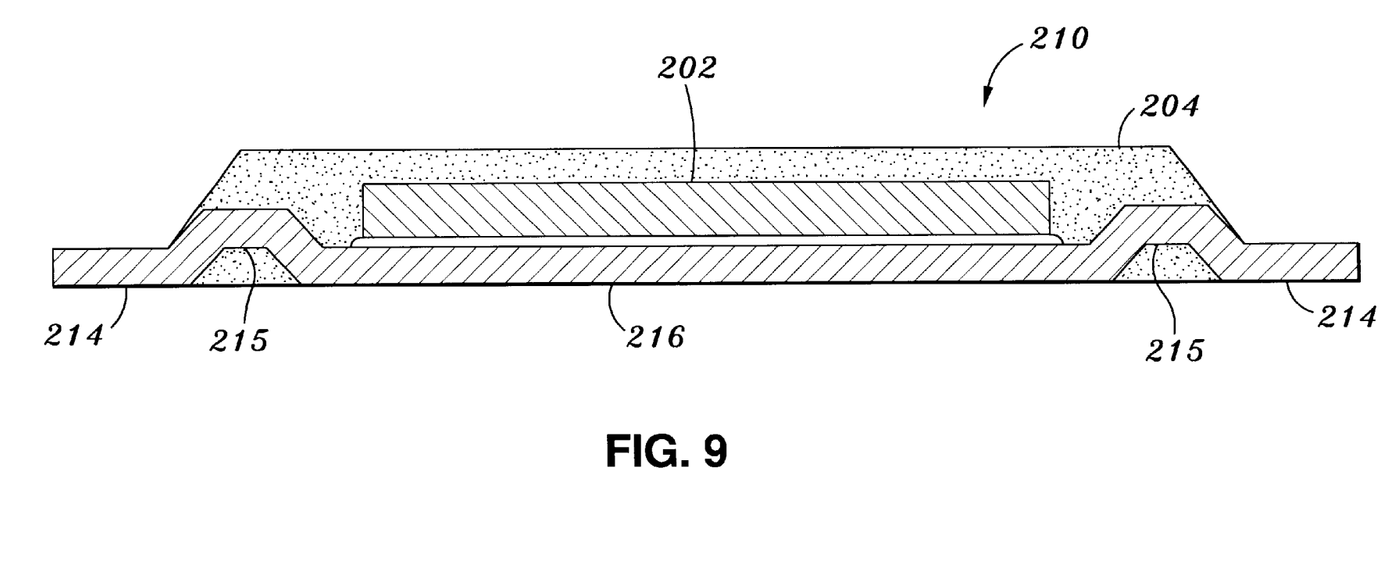
FIG. 9 is a side elevational cross-sectional view of the semiconductor package of FIG. 8 taken along lines 7—7 of the leadframe of FIG. 6.
Figure 10:
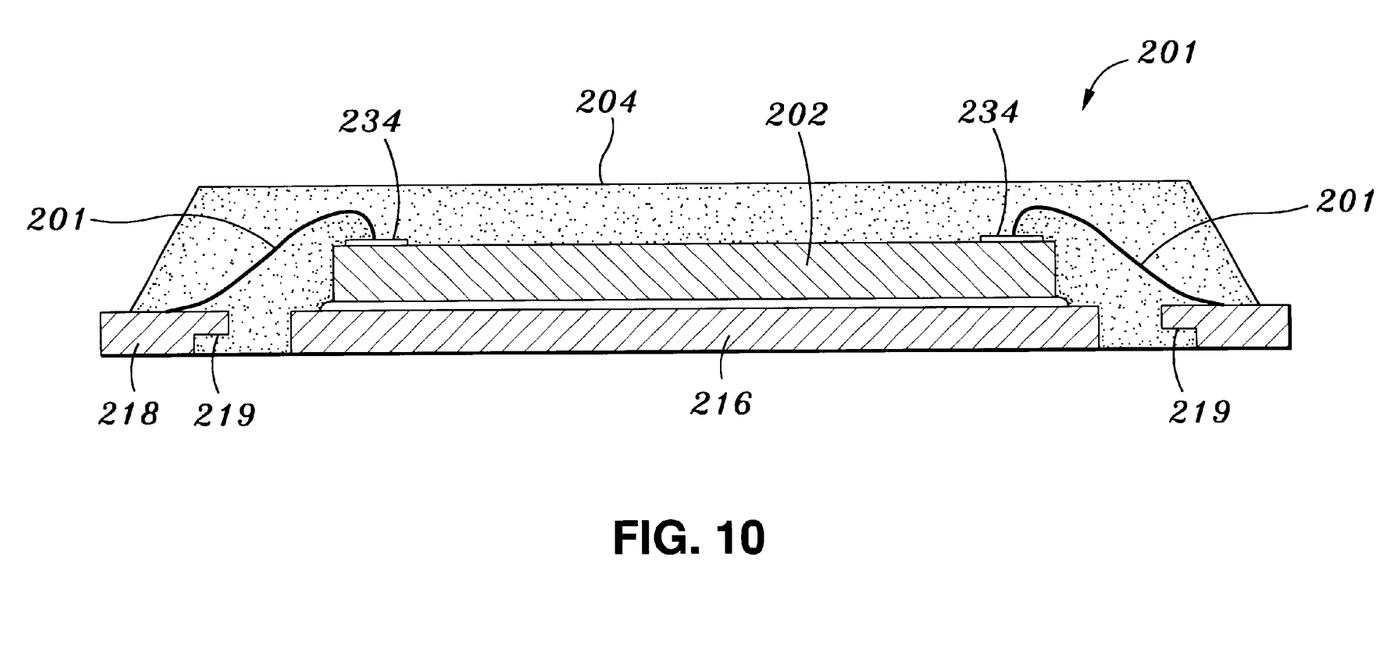
FIG. 10 is a side elevational, cross-sectional view of the semiconductor package of FIG. 8 taken along lines 8—8 of the leadframe of FIG. 6.
Figure 11:
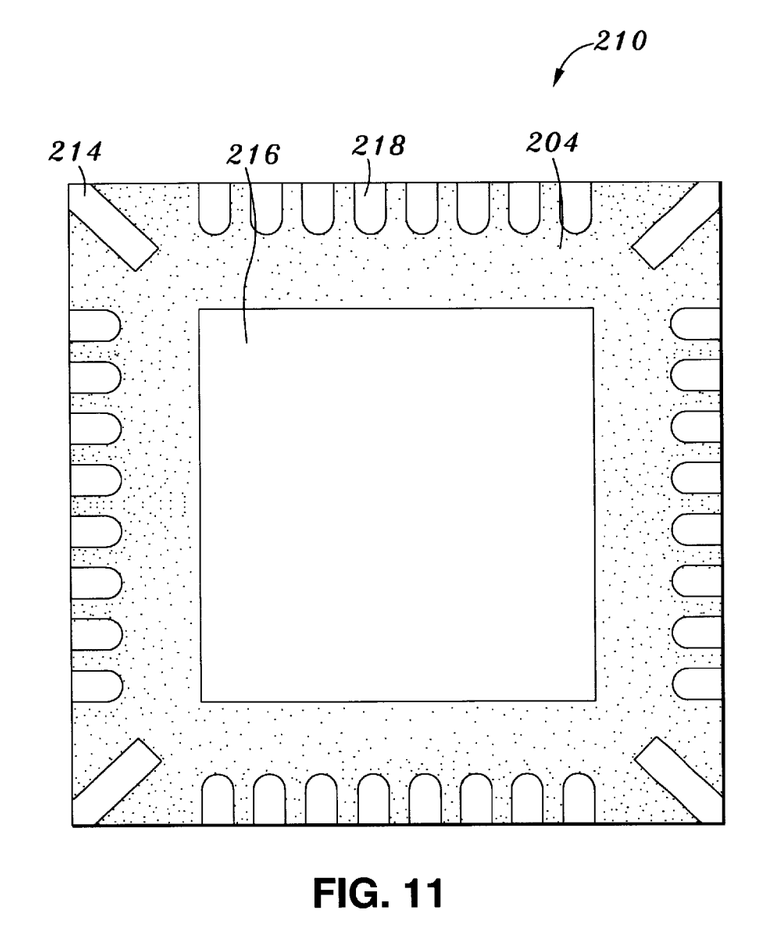
FIG. 11 is a bottom plan view of the semiconductor package of FIG. 8 illustrating the footprint thereof.

With reference to FIGS. 9, 10 and 11 in combination, there is shown a semiconductor package 210 using the leadframe 200 in cross sectional views and in a bottom view. As shown therein, the semiconductor package 210 comprises a semiconductor chip 202 provided with a plurality of bond pads 234, and a chip paddle 216 bonded to the bottom surface of the semiconductor chip 202 via an adhesive. At the corners of the chip paddle 216 are formed tie bars 214 which externally extend. A plurality of internal leads 218 are radially located at a distance away from and along the circumference of the chip paddle 216. Via conductive wires 201, the bond pads 234 of the semiconductor chip 202 are electrically connected to the internal leads 218. An upper surface of each one of internal leads 218 may, but does not necessarily have to be, electroplated with for example, silver or gold, to enhance electrical conductivity. The semiconductor chip 202, the conductive wires 201, the chip paddle 216 and the internal leads 218 are encapsulated by an encapsulation material to create a package body 128 whereas the chip paddle 216, the internal leads 218 and the tie bars 214 are externally exposed in the downward direction of the package body 128. The encapsulation material may be thermoplastics or thermoset resins, with the thermoset resins including, but not limited to, silicones, phenolics, and epoxies. The exposed portions of chip paddle 216, internal leads 218, and tie bars 214 may, but do not necessarily have to be, electroplated with a corrosion-minimizing material such as, for example, tin lead, tin, gold, nickel palidium, tin bismuth, or similar materials known in the art.

A feature of the present invention resides in that a predetermined area of each tie bar 214, which extends externally from a corner of the chip paddle 216, is bent to a predetermined length in the upward direction to form a reverse-down set part 215. Thus, the reverse-down set part 215 is located inside and spontaneously interlocks with the body 128. Additionally, the area of the tie bar 214, which is exposed externally in the downward direction of the body 128, is reduced. In result, the tie bars are further spaced away from neighboring internal leads 218.

When the semiconductor package 210 is mounted on a motherboard, solder is plated on the bottom surfaces of the internal leads 218 and tie bars 214, which are externally exposed in the downward direction of the body 128. The presence of the reverse-down set part has the effect of making smaller the probability that the tie bars 214 are connected to the internal leads 218 through the solder.

In addition, coining parts 219 are formed at the internal leads' ends near the chip paddle, being inside the body. The coining parts 219 are thinner than the remaining areas of internal leads 218, locating inside the body 128. Thus, the internal leads interlock 218 with the body 128 and are prevented from seceding from the body 128 horizontally and vertically by virtue of the coining parts 219.

Figure 12:
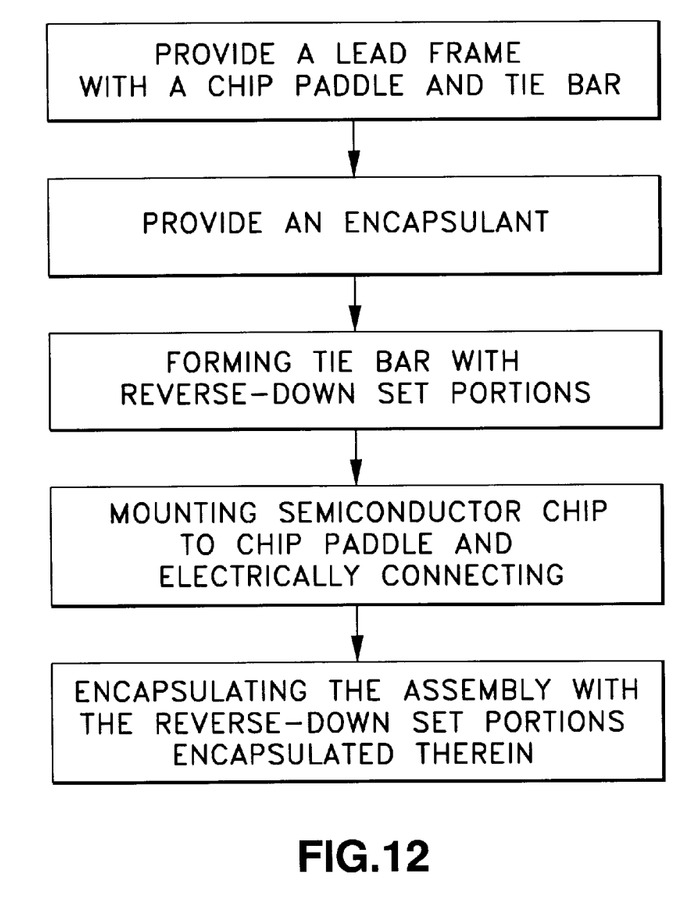
FIG. 12 is a flow diagram illustrating the steps of securing a lead frame within a semiconductor package in accordance with the principles of the present invention.

Referring now to FIG. 12, there is shown a flow diagram illustrating the method of securing a leadframe within a semiconductor package of the type wherein a semiconductor chip is secured thereon. The method comprises the steps of providing a leadframe having a chip paddle and a frame region extending around the paddle. The chip paddle is connected to the frame by oppositely disposed tie bars extending therebetween. Either two or four tie bars can be utilized, as set forth above. The next step provides an encapsulant for encasing a semiconductor chip disposed upon and secured to the chip paddle. The tie bars are formed with reverse-down set portions between the paddle and the frame for preventing the tie bar from being exposed from a lower region of the semiconductor package. A semiconductor chip is then mounted upon and secured to the paddle and is electrically interconnected to select portions of the leadframe. The chip paddle and lead frame assembly is then encapsulated with the semiconductor chip secured therein, and the reverse-down set portions of the tie bars encapsulated therein so as to prevent lateral movement of the tie bar relative to the encapsulant. In a final step, the semiconductor package is singulated from the outer portions of the leadframe as set forth and described in one or more of the copending patent applications referenced and incorporated herein by reference.

The present invention has been described in an illustrative manner, and it is to be understood that the terminology used is intended to be in the nature of description rather than of limitation. Many modifications and variations of the present invention are possible in light of the above teachings. Specifically, the coining can be achieved mechanically, chemically, or a combination thereof, while the material of which the leadframe is made can be a good electrical conductor such as copper, aluminum, or other metals and alloys. The lead frame may also be formed of one material and plated with another material such as, but not limited to, for example gold or silver.

In the leadframe and semiconductor package structure of the present invention, as described hereinbefore, a reverse-down set part is formed in the tie bar supporting the chip paddle by stamping. Reverse-down set part is located inside and thus, interlocks with the package body. In addition, owing to the presence of the reverse-down set part, the tie bar, which is exposed from the package body, is further spaced from the internal lead, so that a short circuit between the tie bar and the internal lead is greatly restrained from being formed by the solder when mounting the semiconductor package on the motherboard. In addition, a coining part is provided to the internal leads, interlocking them with the body spontaneously.

Consequently, the present invention takes advantage of a stamping technique with a reduced probability of forming a short circuit between the internal leads and the tie bars via solder and thus, produces leadframes and semiconductor packages on a large scale.

The following applications are all being filed on the same date as the present application and all are incorporated by reference as if wholly rewritten entirely herein, including any additional matter incorporated by reference therein:

| Application Number | Title of Application | First Named Inventor |
|---|---|---|
| 09/687,787 | Thin and Heat Radiant Semiconductor Package and Method for Manufacturing | Jae Hun Ku |
| 09/687,331 | Leadframe for Semiconductor Package and Mold for Molding the Same | Young Suk Chung |

-continued

| Application Number | Title of Application | First Named Inventor |
| --- | --- | --- |
| 09/687,532 | Method for Making a Semiconductor Package Having Improved Defect Testing and Increased Production Yield | Tae Heon Lee |
| 09/687,876 | Near Chip Size Semiconductor Package | Sean Timothy Crowley |
| 09/687,536 | End Grid Array Semiconductor Package | Jae Hun Ku |
| 09/687,048 | Leadframe and Semiconductor Package with Improved Solder Joint Strength | Tae Heon Lee |
| 09/687,585 | Semiconductor Package Having Reduced Thickness | Tae Heon Lee |
| 09/687,049 | Method for Making Semiconductor Packages | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the invention.

What is claimed is:

1. A leadframe assembly for a semiconductor package, said leadframe comprising:
   a plate-type frame body;
   a plurality of tie bars extending inwardly from said plate-type frame body to a central portion of said leadframe;
   a chip paddle connected to said plurality of tie bars, said chip paddle having a plurality of sides and corners and having an area adapted to receive a semiconductor chip thereupon;
   each of the plurality of tie bars being constructed with a reverse-down set portion adjacent said chip paddle and outside of a perimeter of the chip paddle; and
   a plurality of internal leads formed integral with said plate-type frame body and radially disposed at regular intervals along the perimeter of said chip paddle; and
   encapsulation material encapsulating the plate-type frame body and a semiconductor chip coupled to the chip paddle, wherein a lower surface of the tie bars are externally exposed;
   wherein the reverse-down set portion reduces an area of the externally exposed portion of the respective tie bar.

2. The leadframe assembly for a semiconductor package as set forth in claim 1, wherein said internal leads are thinner at ends proximate to said chip paddle.

3. The leadframe assembly for a semiconductor package as set forth in claim 2, wherein said ends proximate to said chip paddle are coined.

4. The leadframe assembly for a semiconductor package as set forth in claim 1, wherein said tie bars extend outwardly from four corners of said chip paddle.

5. The leadframe assembly for a semiconductor package as set forth in claim 1, wherein said chip paddle is substantially rectangular and said tie bars extend outwardly from opposite corners of said chip paddle, wherein opposite tie bars are axially aligned with each other and wherein further adjacent tie bars are disposed in a substantially orthogonal relationship with each other.

6. The leadframe assembly for a semiconductor package as set forth in claim 1, wherein at least one of said tie bars is bent to a predetermined length in a direction so as to form a reverse-down set portion.

7. The apparatus as set forth in claim 6, wherein said chip paddle, said plurality of external leads and said plurality of internal leads are co-planar.

8. The apparatus as set forth in claim 7, wherein said direction of said at least one of said tie bars is in a different plane than said chip paddle, said plurality of external leads and said plurality of internal leads.

9. The apparatus of claim 1, wherein at least one of said plurality of internal leads has an upper side electroplated with an electrically conductive material.

10. The apparatus of claim 1, further comprising a plurality of external leads wherein each of said plurality of external leads has a respective terminal portion connected to a respective one of said plurality of internal leads.

11. The apparatus of claim 10, further comprising a plurality of dam bars positioned between said plurality of internal leads and said plurality of external leads, said plurality of dam bars firmly fixing said plurality of internal leads and said plurality of external leads to said plate-type frame body.

12. A packaged semiconductor comprising:
    a chip paddle adapted to support a semiconductor chip thereupon and having a receiving area;
    a semiconductor chip coupled to the receiving area and provided with a plurality of bond pads;
    means for bonding said semiconductor chip to said chip paddle;
    a plurality of tie bars externally extended from corners of said chip paddle;
    a plurality of internal leads located at regular intervals along a perimeter of said chip paddle;
    conductive wires electrically connecting the bond pads of the semiconductor chip to said internal leads;
    a package body in which said semiconductor chip, the chip paddle, the tie bars, the internal leads and the conductive wires are encapsulated by an encapsulation material while said chip paddle, said tie bars and said internal leads are externally exposed at their bottom surfaces, and
    at least one of said tie bars being constructed with a reverse-down set portion formed adjacent the chip paddle and outside of a perimeter of the chip paddle to create a space between the at least one tie bar and adjacent ones of the plurality of leads and for minimizing short circuiting between the at least one tie bar and the plurality of leads
    wherein the reverse-down set portion reduces an area of the externally exposed portion of the respective tie bar.

13. The packaged semiconductor as set forth in claim 12, wherein coining parts are formed at ends of the internal leads nearest the chip paddle.

14. The packaged semiconductor of claim 13, wherein said coining parts are adapted to prevent said plurality of internal leads from horizontally and vertically seceding from the packaged semiconductor.

15. The packaged semiconductor of claim 12, wherein said bonding means comprises an adhesive.

16. A semiconductor package of the type adapted for receiving a semiconductor chip and wherein said semiconductor chip has a plurality of bond pads, said semiconductor package comprising:
- a chip paddle adapted to support the semiconductor chip thereupon and for providing a bonding surface;
- a plurality of tie bars extending outwardly from the corners of said chip paddle;
- a plurality of internal leads located at regular intervals along a perimeter of said chip paddle;
- conductive wires for electrically connecting the bond pads of the semiconductor chip to said plurality of internal leads;
- a package body in which said semiconductor chip, the chip paddle, the tie bars, the internal leads and the conductive wires are encapsulated by an encapsulation material while said chip paddle, the said tie bars and said internal leads are externally exposed at their bottom surfaces; and
- at least one of said tie bars being constructed with a reverse-down set portion formed adjacent the chip paddle and outside of a perimeter of the chip paddle for minimizing short circuiting between the at least one tie bar and the plurality of leads;
- wherein the reverse-down set portion reduces an area of the externally exposed portion of the respective tie bar.

17. The semiconductor package as set forth in claim 16, further comprising a coining surface at a portion of said internal leads nearest the chip paddle.

18. The semiconductor package as set forth in claim 17, wherein said coining surface is adapted to prevent said plurality of internal leads from horizontally and vertically seceding from the packaged semiconductor.

19. A leadframe adapted for securement within an encapsulation material for the containment of a semiconductor chip mounted thereto, said leadframe comprising:
- a chip paddle adapted for the receipt of said semiconductor chip thereupon;
- a frame disposed about the periphery of said chip paddle and spaced therefrom;
- a plurality of tie bars extending between said chip paddle and said frame for the interconnection thereof; and
- wherein at least one of said tie bars is formed with a reverse-down set portion therein for securing said at least one tie bar within said encapsulation material and for preventing the exposure of said at least one tie bar in select portions of said semiconductor package.

* * * * *